United States Patent
Choi et al.

[19]

[11] Patent Number: 5,920,225
[45] Date of Patent: *Jul. 6, 1999

[54] NEGATIVE VOLTAGE DRIVE CIRCUIT

[75] Inventors: Young Jung Choi, Chungcheongbuk-Do; Joo Weon Park, Seoul, both of Rep. of Korea

[73] Assignee: Hyundai Electronic Industries, Co., Ltd., Kyungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/770,700

[22] Filed: Dec. 19, 1996

[51] Int. Cl.⁶ ....................................................... G05F 3/02
[52] U.S. Cl. ........................... 327/536; 327/534; 327/537; 327/390; 327/589; 307/110
[58] Field of Search ..................................... 327/534, 535, 327/536, 537, 390, 589; 307/110

[56] References Cited

U.S. PATENT DOCUMENTS

| | | | |
|---|---|---|---|
| 5,202,588 | 4/1993 | Matsuo et al. . | |
| 5,266,843 | 11/1993 | Walker et al. | 327/534 |
| 5,285,370 | 2/1994 | Axer et al. | 307/110 |
| 5,287,536 | 2/1994 | Schreck et al. . | |
| 5,309,402 | 5/1994 | Okazawa . | |
| 5,343,088 | 8/1994 | Jeon | 327/536 |
| 5,502,415 | 3/1996 | Matsui et al. | 327/536 |
| 5,521,871 | 5/1996 | Choi | 327/536 |
| 5,633,825 | 5/1997 | Sakuta | 327/534 |
| 5,636,115 | 6/1997 | Drouot | 327/536 |
| 5,672,992 | 9/1997 | Nadd | 327/537 |
| 5,701,096 | 12/1997 | Higashiho | 327/536 |
| 5,708,387 | 1/1998 | Cleveland et al. | 327/544 |

FOREIGN PATENT DOCUMENTS

| | | | |
|---|---|---|---|
| 08153394 | 6/1996 | Japan | G11C 16/06 |
| 2 261 307 | 5/1993 | United Kingdom . | |
| 0576008 2 | 6/1993 | United Kingdom . | |
| 2 265 770 | 6/1993 | United Kingdom . | |

*Primary Examiner*—Terry D. Cunningham
*Attorney, Agent, or Firm*—Scott C. Harris, Esq.

[57] ABSTRACT

The present invention discloses a negative voltage drive circuit which does not takes an influence from the load capacitor or the power supply voltage drive circuit according to the present invention comprises a cross pumping circuit, a pumping unit block and circuit for supplying VCC or VSS power supply voltages for the pumping unit block.

6 Claims, 5 Drawing Sheets

NEGATIVE VOLTAGE DRIVE CIRCUIT

FIELD OF THE INVENTION

The present invention relates to a negative voltage drive circuit, and more particularly to a negative voltage drive circuit for supplying a negative voltage to the gate electrode of a flash EEPROM cell.

BACKGROUND OF THE INVENTION

In general, in order to erase a data stored on the flash EEPROM, a negative voltage is supplied to the gate electrode of the flash EEPROM cell.

In order to supply such a negative voltage, clock signals CLK1 and CLK2 are input to the clock signal generator 1 as shown in FIG. 1. Depending on the first and second clock signals CLK1 and CLK2 which is output from the clock signal generator 1, a first, second and third negative voltages VNQP, VINQP and VINQPB are generated at the charge pump 2. Each of the first and second negative voltages VLNQP and VINQPB is supplied to a first and second negative voltage drive circuits 3A and 3B, respectively. Each of the first and second output signals S1 and S2 of the first and second negative voltage drive circuits 3A and 3B is input to the gate electrodes of the pass transistors P1 and P2, respectively. The first negative voltage VNQP is supplied to the program gate PG of the flash EEPROM cell 4 depending on the drive of the pass transistors P1 and P2. The first and second negative voltage drive circuits 3A and 3B are substanially same in their constructions.

The present invention is directed to the negative voltage drive circuit 3 shown in FIG. 1.

The conventional negative voltage drive circuit will be explained by reference to FIG. 2. FIG. 2 illustrates a detailed circuit diagram of the first negative voltage drive circuit shown in FIG. 1.

A first clock signal CK1 is applied to the pumping capacitor M1 and a second clock signal CK2 is applied to the pumping capacitor M2. The first and second clock signals CK1 and CK2 are opposite in phase.
PMOS transistors P1 and P2, to which the first and second clock signals CK1 and CK2 via the pumping capacitors M1 and M2 are input, are alternately turned on and thus the negative voltage VINQP is sent to the output terminal Vout connected to the load capacitor CL.

As the pumping capacitor M1 is directly connected to the output terminal Vout, however, the voltage which is coupled by the pumping capacitors M1 and M2 varies based on the load. In addition, as the PMOS transistors P1 and P2 take the Body Effect, the threshold voltages of the PMOS transistors increase. If this threshold voltage is higher than the coupling voltage generated by the ratio of the pumping capacitors M1 and M2 and the load capacitor CL, the PMOS transistors P1 and P2 are no longer turned on. Therefore, as the output voltage of the charge pump is no longer generated, the output therefrom becomes saturated.

Also, if the capacity of the load capacitor CL is greater than that of the pumping capacitors M1 and M2 and also the Gamma Effect (γ Effect) is great enough, the output therefrom will be saturated before it decreases to a given voltage. As a result, there is a problem in that the output voltage of such a circuit takes a lot of influence due to the load capacitance.

In addition, as the coupling voltage varies with the clock signals, there is a shortcoming that it takes a lot of influence based on the power supply voltage Vcc.

SUMMARY OF THE INVENTION

Accordingly, it is an object of the present invention to provide a negative voltage drive circuit which can supply a negative voltage for the gate electrode of the flash EEPROM cell without having an influence from the output voltage of the charge pump due to the capacity of the load capacitor or a power supply voltage.

To achieve the above object, a negative voltage drive circuit according to the present invention, comprises:

a cross pumping circuit including;

a first means for connecting between a first input terminal, to which a first output of a charge pump is input, and an output terminal based on a first clock signal via a first pumping capacitor and a second clock signal via a second pumping capacitor, and a second means for disconnecting the connection made between the first input terminal and the output terminal depending on the first clock signal via the first pumping capacitor and the second clock signal via the second pumping capacitor, and for dropping the potential of the output terminal based on the first clock signal via a third pumping capacitor;

a pumping unit block connected to the cross pumping circuit, for stabilizing the potential of the output terminal with the first output of the charge pump and the second output of the charge pump; and a third means connected to the pumping unit block, for supplying VCC or VSS voltages for the pumping unit block based on control signals.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DESCRIPTION OF THE INVENTION

The present invention will be described below in detail by reference to the accompanying drawings.

Figure 3:
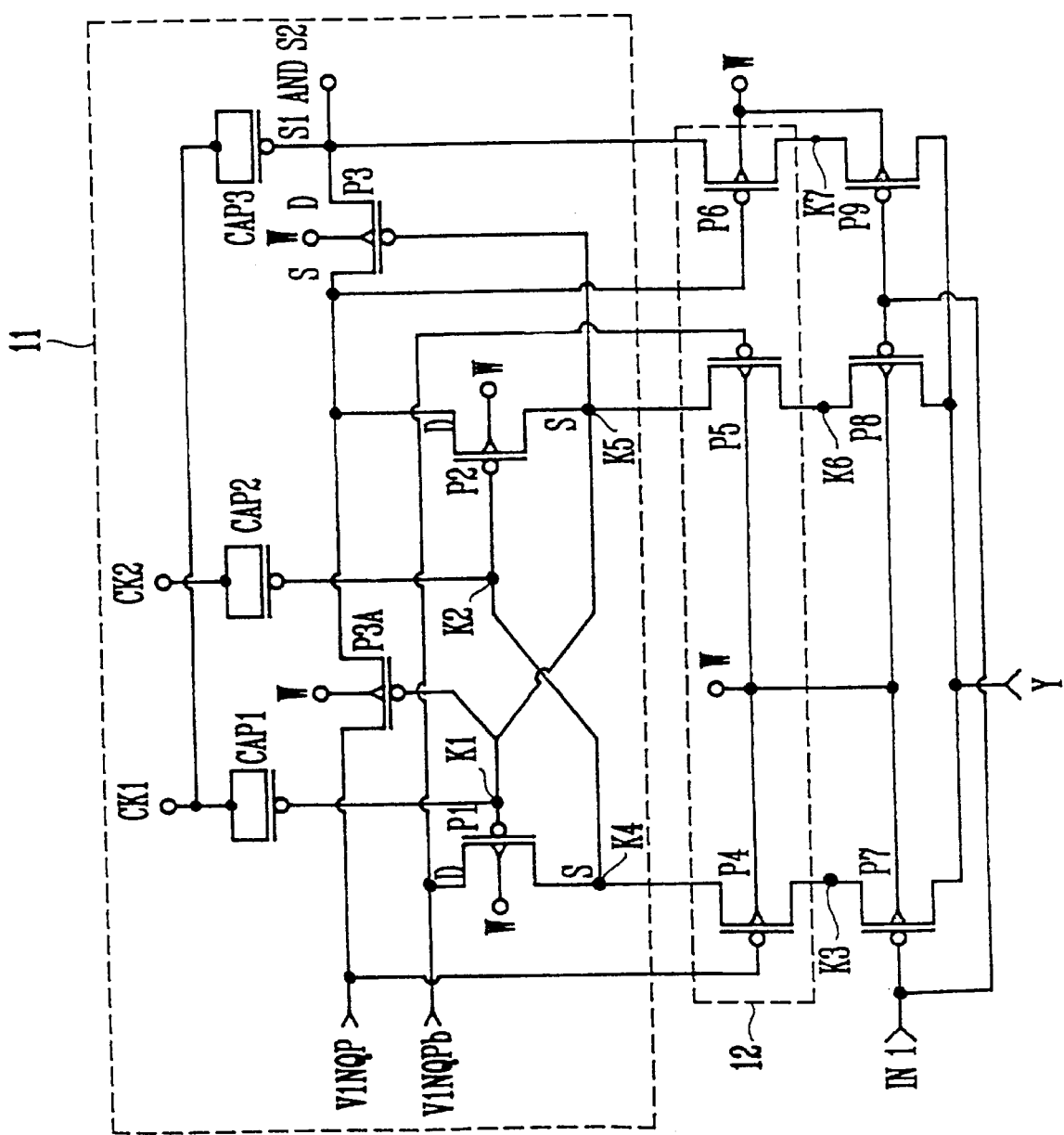
FIG. 3 illustrates a negative voltage drive circuit according to a first embodiment of the present invention.

Referring to FIG. 3 the cross pumping circuit 11 is constructed as follows.

The gate electrode of the transistor P1 is connected to the gate electrode 4 of the transistor P3 and the source electrode of the transistor P2. The source electrode of the transistor P2 is connected to the source electrode of the transistor P1. The gate electrode of the transistor P1 is connected between the input terminal VINQP and the source electrode of the transistor P3. The drain electrode of the transistor P1 is connected to the input terminal VINQPB, while the drain electrode of the transistor P2 is connected to the source electrode of the transistor P3.

The pumping capacitor CAP1 is connected between the input terminal CK1 and the gate electrode of the transistor P1, while the pumping capacitor CAP2 is connected between the input terminal CK2 and the gate electrode of the transistor P2. The pumping capacitor CAP3 is connected between the input terminal CK1 and the source electrode of the transistor P3.

The pumping unit block 12 comprises transistors P4, P5 and P6. The transistor P4 is connected between the source electrode of the transistor P1 and the node K3. The transistor P5 is connected between the source electrode of the transistor P2 and the node K6.

The transistor P6 is connected between the source electrode of the transistor P3 and the node K7. The gate electrode of the transistor P4 is connected to the input terminal VINQP, while the gate electrode of the transistor P5 is connected to the input terminal VINQPB. The gate electrode of the transistor P6 is connected to the source electrode of the transistor P3.

The transistor P7 is also connected between the node K3 and the node Y. The transistor P8 is connected between the node K6 and the node Y and the transistor P9 is connected between the node K7 and the node Y.

The gate terminals of the transistors P7, P8 and P9 are connected to the input terminal IN1. The reference numeral W indicates a well bias voltage. The clock signals each of which has an opposite phase are input to the input terminals CK1 and CK2, respectively. At the active mode, the input terminal IN1 is maintained at low level. The node Y has to be maintained at low level so as to output a negative voltage to the output terminals S1 and S2 and otherwise it has to be maintained at high level VCC.

For example, if a high level of clock signal is input at the input terminal CK1, while a low level of clock signal is input at the input terminal CK2, the transistors P3A and P3 are turned on and the input terminal VINQP and the output terminals S1 and S2 are connected to each other.

As the input is at low level and the output is at high level, the charges are discharged from the output terminals S1 and S2 to the input terminal CK2 and therefore the voltages of the output terminals S1 and S2 are dropped. Also, as the transistor P1 is turned on, the node K4 is also discharged.

On the contrary, if a low level of clock signal is input at the input terminal CK1 while a high level of clock signal is input at the input terminal CK2, the transistor P2 is turned on and the potential of the node K5 becomes same with that of the input terminal VINQP. Accordingly the transistor P3 is turned off and during the low level of clock signal is input at the input terminal CK2, the potential of the output terminals S1 and S2 is dropped by the capacitor CAP3. As these drives continue, the potential of the output terminals S1 and S2 becomes lower than the output VNQP of the negative charge pump.

The transistors P4, P5 and P6 are the devices having a low breakdown voltage. The potential of the output terminals S1 and S2 is kept constant by these transistors P4, P5 and P6. VCC or VSS power supply voltages are supplied to the transistors P4, P5 and P6 based on the drive of the transistors P7, P8 and P9. If the VCC power supply voltage is supplied to the transistors P4, P5 and P6, a negative power supply voltage is not generated from the output terminals S1 and S2.

The outputs S1 and S2 of the voltage drive circuit are the voltage of the node K5 plus the threshold voltage Vtp of the transistor P3 because the node K5 is connected to the gate electrode of the last transistor P3 (that is, Vs1=Vs2=Vk5+Vtp). Therefore, when the node K5 arrives at the breakdown voltage, the output of the voltage drive circuit has a maximum value.

Figure 1:
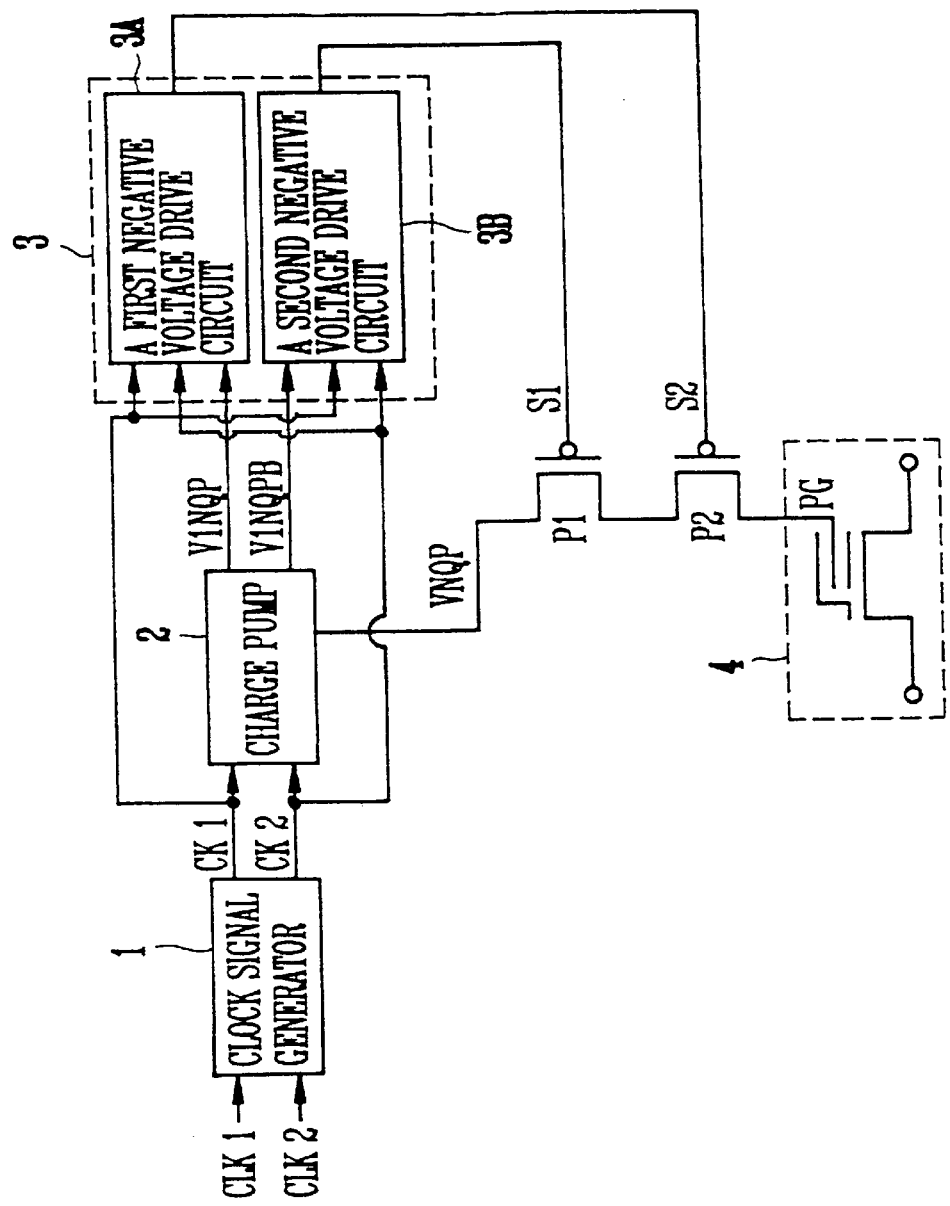
FIG. 1 is a block diagram to illustrate the negative charge pump.
Figure 2:
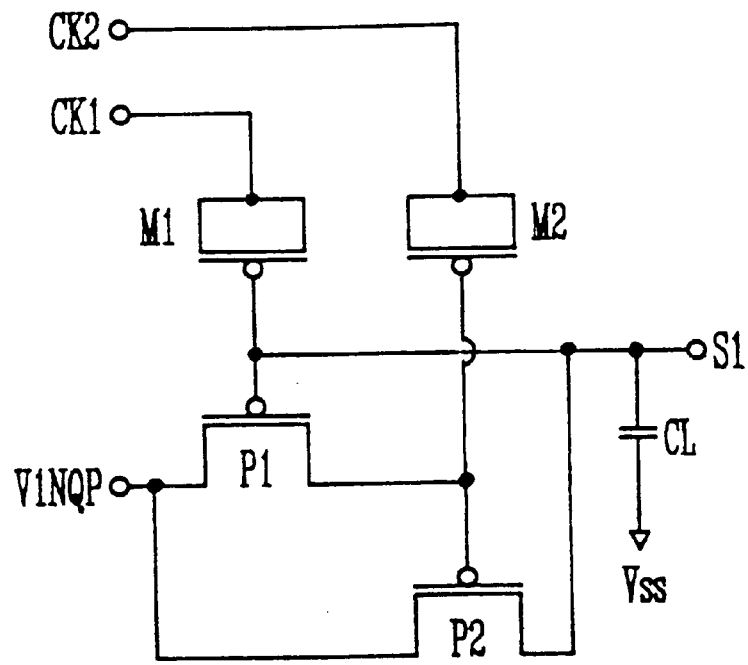
FIG. 2 illustrates a conventional negative voltage drive circuit.
Figure 4:
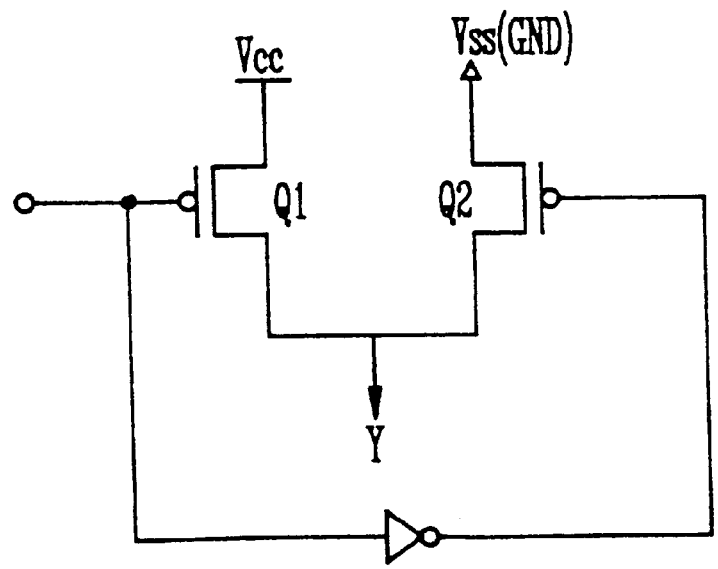
FIG. 4 illustrates a circuit diagram which turns the node of FIG. 3 into VCC or VSS potentials.

FIG. 4 illustrates a circuit diagram which turns the node of FIG. 3 into VCC or VSS potentials. If the control signal ZVCSb is at high level, the transistor Q2 is turned on and the node Y is kept at VSS potential. While, if the control signal ZVCSb is at low level, the transistor Q1 is turned on and the node Y is kept at VCC potential.

Figure 5:
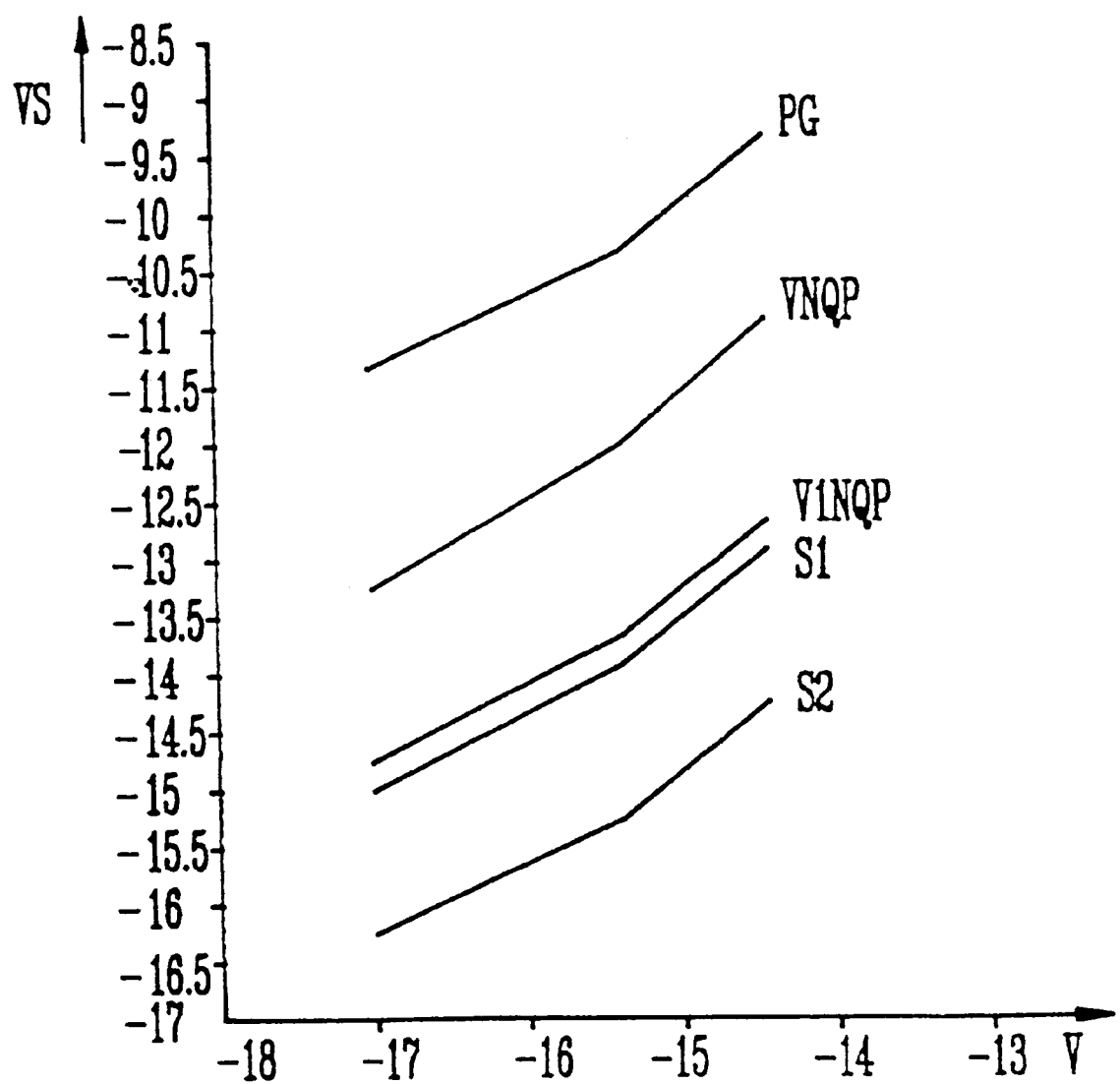
FIG. 5 illustrates a characteristic view to show variation of the output voltage based on the breakdown voltage of the negative voltage drive circuit.

FIG. 5 illustrates a characteristic view to show variations of the output voltage Vs based on the breakdown voltage V of the negative voltage drive circuit. As the breakdown voltage becomes greater (absolute value larger), small variation can be seen at the low Vcc and a large variation can be seen at the high Vcc. This means that, as the breakdown does not occur at the low voltage it will not have an influence therefrom though the breakdown voltage varies, and it takes an direct effect due to variation of the breakdown voltage at the region where the breakdown has occurred.

Figure 6:
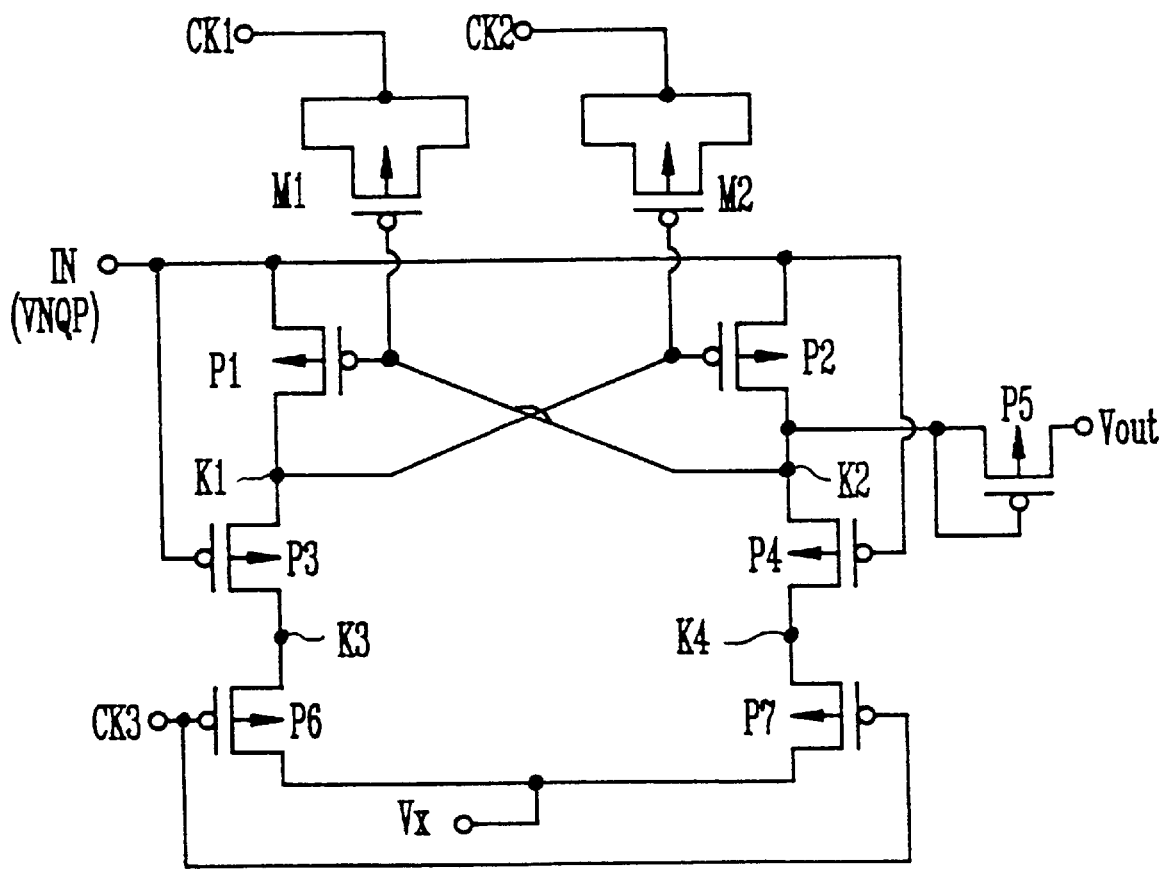
FIG. 6 illustrates a negative voltage control circuit in accordance with a second embodiment of the present invention.

FIG. 6 illustrates a negative voltage control circuit in accordance with a second embodiment of the present invention.

Between an input terminal IN to which a negative voltage VNQP is provided from a charge pump(not shown) and a node K1 is connected a PMOS transistor P1 which is activated by a first clock signal CK1 via a pumping capacitor M1. Between the input terminal IN to which a negative voltage VNQP is provided from the charge pump and a node K2 is connected a PMOS transistor P2 which is turned on in accordance with a second clock signal CK2 via a pumping capacitor M2. Each gate electrode of the PMOS transistors P1 and P2 is connected to the nodes K2 and K1 individually. Between the node K2 and an output terminal Vout is connected a transistors P5. Between the node K1 and a node Vx are serially connected PMOS transistors P3 and P6.

Between the node K2 and the node Vx are serially connected PMOS transistors P4 and P7. A negative voltage VNQP is applied to gate electrodes of the PMOS transistors P3 and P4. A third clock signal CK3 is applied to gate electrodes of the PMOS transistors P6 and P7. The node Vx must have a ground level so as to supply an output voltage from the charge pump for the output terminal Vout of the negative voltage control circuit, and the third clock signal CK3 must be kept at low level. The first clock signal CK1 and the second clock signal CK2 are opposite in phase to each other. The PMOS transistors P1 and P2 are alternately turned on in accordance with the first and second clock signals CK1 and CK2.

At this time, as the PMOS transistors P3 and P4 are activated by the negative voltage VNQP, the voltage levels K1 and K2 are in turn maintained at lower levels than the junction breakdown voltage of the PMOS transistors P3 and P4.

Accordingly, a negative voltage which is lower than the junction breakdown voltages of the transistors P3 and P4 is output though the clamping transistor P5.

On the other hand, in order to shut off the negative voltage provided through the output terminal Vout of the negative voltage control circuit, the supply of the first and second clock signals CK1 and CK2 has to be shut off, the third clock signal CK3 has to be kept at low state and the voltage level of the node Vx has to be maintained at high level. A high level of positive voltage is provided to the nodes K1 and K2 through the transistors P6 and P7 to which is activated by the third clock signal CK3 and the transistors P3 and P4 to which a negative voltage is applied. Therefore, as the positive voltage is input into the source electrode of the transistor P5 functioning as a clamping, the negative voltage is shut off. The circuit having the above construction may be consisted of several blocks. The block may have a switching function to allow a clock signal to be provided only for the first and second clock signals CK1 and CK2

Also, as the voltage of the nodes K3 and K4 is maintained at a voltage which is elevated as much as the threshold voltage Vt after the body effect is occurred at the transistors P3 and P4, an enough negative voltage is provided to the output terminal Vout of the negative voltage control circuit.

As mentioned above, the present invention has an outstanding effect which can supply a negative voltage for the gate electrode of the cell during an erasure operation of the flash memory cell.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. A negative voltage drive circuit comprising:

a cross pumping circuit including;

a first means for connecting between a first input terminal, to which a first output of a charge pump is input, and an output terminal based on a first clock signal via a first pumping capacitor and a second clock signal via a second pumping capacitor, and a second means for disconnecting the connection made between said first input terminal and said output terminal depending on the first clock signal via said first pumping capacitor and the second clock signal via said second pumping capacitor, and for dropping the potential of said output terminal based on the first clock signal via a third pumping capacitor;

a pumping unit block connected to said cross pumping circuit, for stabilizing the potential of said output terminal with said first output of said charge pump and said second output of said charge pump; and a third means connected to said pumping unit block, for supplying VCC or VSS voltages for said pumping unit block based on control signals.

2. The circuit claimed in claim 1 wherein said cross pumping circuit comprises first and second transistors serially connected between said first input terminal to which said first output of said charge pump is input and said output terminal:

a third transistor connected between said second input terminal to which said second output of said charge pump is input and a first node connected to said pumping unit block, a gate electrode thereof being connected to a gate electrode of said first transistor; and a fourth transistor connected between a connection node of said first and second transistors and a second node connected to a gate electrode of a said third transistor and the pumping unit block, wherein a gate electrode of said fourth transistor is connected to said first node.

3. The circuit claimed claim 1 wherein said pumping unit block comprises a first transistor connected between the first node and said third means, said first transistor being driven based on the first output of the charge pump;

a second transistor connected between the second node and said third means, said transistor being driven based on said second output of the charge pump; and a third transistor connected between the output terminal and said third means, said third transistor being driven based on the first output of said charge pump.

4. The circuit claimed in claim 1 wherein said third means comprises first, second and third transistors connected between a node to which a VCC or VSS is supplied and said pumping unit block based control signals.

5. A negative voltage control circuit comprising:

a first transistor connected between an input terminal to which a negative voltage is provided and a first node, wherein a gate electrode of which is connected to a second node;

a second transistor connected between said input terminal and said second node, wherein a gate electrode of which is connected to said first node;

first and second pumping capacitors for supplying first and second clock signals for said first and second nodes;

a third transistor connected between said first node and a third node, wherein said third transistor is activated by the negative voltage;

a fourth transistor connected between said second node and a fourth node and wherein said fourth transistor is activated by the negative voltage;

a fifth transistor connected between a fifth node having a high or low level and said third node, said transistor operating in accordance with a third clock signal;

a sixth transistor connected between said fourth node and said fifth node, said transistor operating in accordance with the third clock signal; and a seventh transistor connected between said second node and an output terminal.

6. The negative voltage control circuit claimed in claim 5 wherein said first, second, third, fourth, fifth, sixth and seventh transistors are MOS transistors.

* * * * *